United States Patent [19]

Kosakowski et al.

[11] 3,882,488

[45] May 6, 1975

[54] ANALOG TO DIGITAL CONVERTER SYSTEM INCLUDING COMPUTER CONTROLLED FEEDBACK MEANS

[75] Inventors: Henry R. Kosakowski, Denville; Douglas J. Washburn, Morristown, both of N.J.

[73] Assignee: The Bendix Corporation, Teterboro, N.J.

[22] Filed: Dec. 26, 1973

[21] Appl. No.: 428,156

[52] U.S. Cl..... 340/347 CC; 340/347 AD; 235/183; 324/99 D; 324/111

[51] Int. Cl. .......... H03k 13/00

[58] Field of Search.......... 340/347 CC, 347 AD; 235/151.52; 328/127, 144, 162, 209; 324/99 D

[56] References Cited

UNITED STATES PATENTS

| | | | |
|---|---|---|---|
| 3,192,371 | 6/1965 | Brahm | 235/183 |
| 3,305,854 | 2/1967 | Witt | 340/347 |
| 3,310,663 | 3/1967 | Bouman | 235/151.1 |
| 3,673,392 | 6/1972 | Holm | 235/150.5 |
| 3,713,023 | 1/1973 | Metcalf et al. | 324/99 D |
| 3,792,352 | 2/1974 | Metcalf et al. | 324/99 D |

*Primary Examiner*—Malcolm A. Morrison
*Assistant Examiner*—Vincent J. Sunderdick
*Attorney, Agent, or Firm*—Anthony F. Cuoco; S. H. Hartz

[57] ABSTRACT

An analog to digital converter is arranged with binary digital computer controlled feedback means for increasing the resolution of the converter without increasing hardware. A resolution of $2^{x+z}$ counts is obtainable by using the feedback means in conjunction with an analog to digital converter having a resolution of $2^x$ counts and a digital to analog converter having a resolution of $2^z$ counts.

6 Claims, 2 Drawing Figures

ANALOG TO DIGITAL CONVERTER SYSTEM INCLUDING COMPUTER CONTROLLED FEEDBACK MEANS

BACKGROUND OF THE INVENTION

1. Field of the Invention

This invention relates generally to analog to digital converter systems including binary digital computer controlled feedback means and, particularly, to a converter system wherein the useful resolution is increased without increasing hardware. More particularly, this invention relates to a converter system of the type described wherein the burden of increased resolution is placed entirely on the computer.

2. Description of the Prior Art

Analog to digital converter systems having binary digital controlled feedback means generally include a sensor which develops an analog signal, and which analog signal is summed with a feedback signal from a digital to analog converter to provide an error signal. The error signal is gain adjusted by a factor (K) and applied through an analog to digital converter for updating an integrator in the computer. The integrator output is a digital representation of the sensor input. The feedback loop is closed by dividing the integrator output by a predetermined scale factor and applying the resulting digital signal to the digital to analog converter whereby the integrator is scaled to said converter.

In high gain systems wherein the resolution ($2^x$ counts) of the digital to analog converter is less than the resolution ($2^y$ counts) of the integrator, the output of the analog to digital converter is forced to hunt back and forth within a band corresponding to the resolution of the integrator divided by the resolution of the digital to analog converter ($2^y/2^x = 2^{y-x}$ counts). Consequently, unless the gain of the system is reduced to the point where the output equivalent of one count to the digital to analog converter generates less than one count out of the analog to digital converter, the least significant bit of the digital to analog converter output will be in constant movement, except under conditions when the sensor output equals the output of the digital to analog converter, and at which time the error signal is zero.

Prior to the present invention these disadvantages have been overcome by additional hardware which resulted in a more complex and costly converter.

SUMMARY OF THE INVENTION

The device of the present invention contemplates means for developing a higher effective feedback resolution without the aforenoted additional hardware. When the integrator output is divided by the predetermined scale factor, digital signals corresponding to a quotient (Q) and a remainder (R) are provided. The quotient signal is applied to the digital to analog converter and the remainder signal, which represents the resolution lost in scaling the integrator to the digital to analog converter, is multiplied by a signal which is a function of the gain adjustment (K) and the weight of a least significant bit in the digital to analog converter and the analog to digital converter outputs. The resulting signal is summed with the output from the analog to digital converter and the summation signal is applied to update the integrator. The summation signal has the capability of reaching zero counts under any condition of voltage error between the condition sensor and the output of the digital to analog converter.

The main object of this invention is to provide an analog to digital converter system including computer controlled feedback means, said converter system having increased resolution without increased hardware.

Another object of this invention is to provide an analog to digital converter system having a resolution capability of $2^{x+z}$ counts through the use of an analog to digital converter with a resolution of $2^z$ counts and a digital to analog converter with a resolution of $2^x$ counts in association with binary digital computer controlled feedback means. A resolution of $2^{x+z}$ counts exists when $2^{y-x}$ counts equals $2^z$ counts and gain adjustment factor K is such that one count into the digital to analog converter causes a change in the output of the analog to digital converter equal to $2^z$ counts.

Another object of this invention is to achieve said resolution and at the same time eliminate hunting of the analog to digital converter output without sacrificing system gain or introducing dead band as has heretofore been the case.

Another object of this invention is to provide a converter of the type described wherein the loss of information due to the lack of resolution is minimized.

The foregoing and other objects and advantages of the invention will appear more fully hereinafter from a consideration of the detailed description which follows, taken together with the accompanying drawing wherein one embodiment of the invention is illustrated by way of example. It is to be expressly understood, however, that the drawing is for illustration purposes only and is not to be construed as defining the limits of the invention, reference being had to the appended claims.

DESCRIPTION OF THE INVENTION

Figure 1:
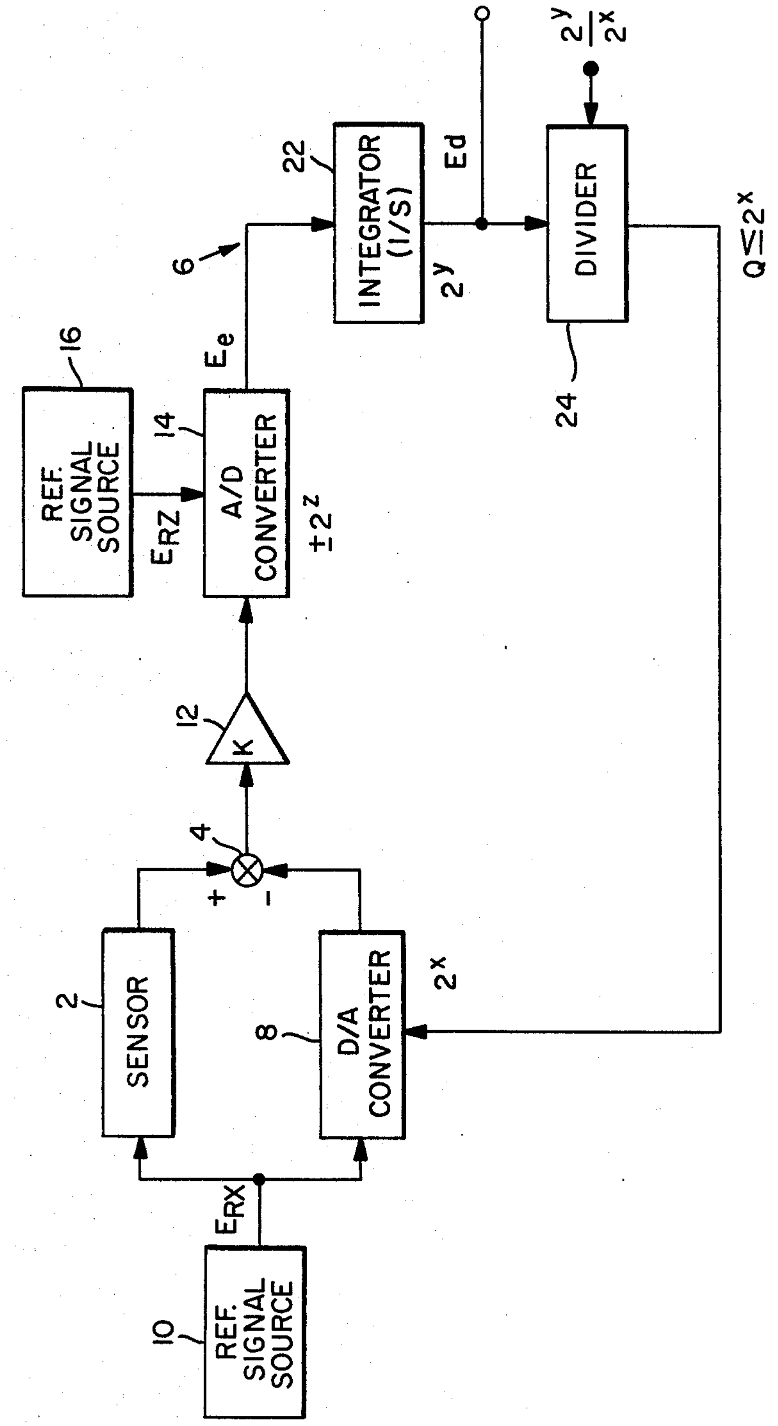
FIG. 1 is a block diagram of the analog to digital converter including feedback means arranged in a configuration having disadvantages which the present invention overcomes.

With reference first to FIG. 1, a condition sensor 2, which may be a pressure sensor of the type used in air data computers for computing aircraft navigational information, senses a condition (atmospheric pressure) and provides a corresponding analog signal (indicative of the altitude of the aircraft) which is applied to a summing means 4. A feedback path includes a binary digital computer 6 and a digital to analog converter 8. Converter 8 converts the digital signal from computer 6 to an analog signal and the analog signal from converter 8 is applied to summing means 4 and summed thereby with the signal from sensor 2. Sensor 2 and digital to analog converter 8 are energized by a signal $E_{Rx}$ from a reference signal source 10. Converter 8 has a resolution of, for example, $2^x$ counts.

The signal from summation means 4, which corresponds to the difference between the signals from sensor 2 and digital to analog converter 8 and in this respect is an error signal, is applied through an amplifier 12 having a gain K and therefrom to an analog to digital converter 14 energized by a signal $E_{Rz}$ from reference signal source 16. Converter 14 has a resolution of, for example, $\pm 2^z$ counts. The output from analog to digital converter 14 is a digital representation of the error signal and is designated as $E_e$. Converters 8 and 14 are of the type well known in the art such as described at pages 674–675, *Pulse Digital and Switching Waveforms*, Millman & Taub, McGraw Hill, 1965.

Computer 6 includes various arithmetic means such as an integrator 22 and divider 24. For this purpose computer 6 may be a general purpose binary digital computer of the type marketed by the Navigation and Control Division of The Bendix Corporation, Teterboro, N.J., and designated as the BDX 900 Computer as described in their *Publication No.* 7010–1, dated Oct. 1, 1970.

Signal $E_e$ from analog to digital converter 14 is applied to integrator 22 in computer 6 to update the integrator, and which integrator provides an output $E_d$ which is a digital representation of the analog signal from sensor 2. Integrator 22 has a resolution of $2^y$ counts. The feedback loop is closed by applying digital output $E_d$ to divider 24 and dividing said output by a predetermined scale factor divisor (corresponding to a resolution of $2^y/2^x$ counts) to scale integrator 22 to converter 8. The digital quotient signal Q (corresponding to a resolution $\leqslant 2^x$ counts) provided by divider 24 is applied to converter 8 which converts the digital signal to an analog signal.

Figure 2:
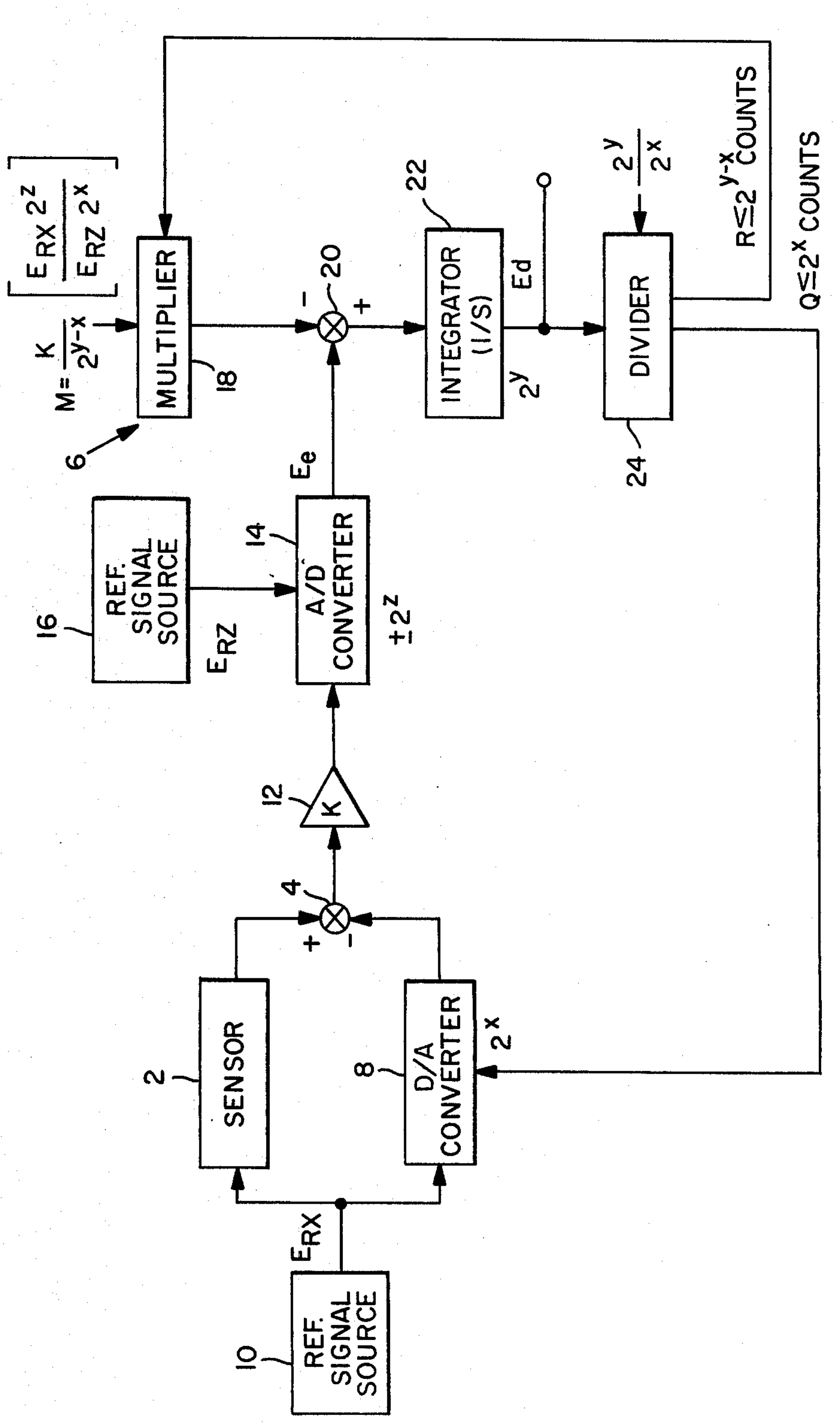
FIG. 2 is a block diagram illustrating the feature of the invention for overcoming the disadvantages of the configuration of FIG. 1.

In high gain systems wherein the resolution of feedback digital to analog converter 8 ($2^x$ counts) is less than the resolution of integrator 22 ($2^y$ counts), error signal $E_e$ is forced to continuously hunt within the band of $2^y/2^x = 2^{y-x}$ counts. Consequently, unless gain K of amplifer 12 is reduced to the point where the output equivalent of one count into digital to analog converter 8 generates less than one count out of analog to digital converter 14, the least significant bit of digital to analog converter 8 will be in constant movement, except when the output of sensor 2 equals the output of converter 8 and at which time signal $E_e$ is zero. In order to overcome this disadvantage the configuration of the invention as illustrated in FIG. 2 is employed, wherein computer 6 is shown as further including a multiplier 18 and a summing means 20.

The division accomplished by divider 24 results in quotient signal Q (corresponding to a resolution $2^x$ counts) as heretofore noted and a remainder signal R (corresponding to a resolution $\leqslant 2^{y-x}$ counts). Remainder signal R represents the resolution lost in scaling integrator 22 to digital to analog converter 8. To accommodate this condition, multiplier 18 in computer 6 multiplies remainder signal (R) by a multiplier (M) commensurate with the gain (K) of amplifier 12 and the weight of a least significant bit in digital to analog converter 8 and analog to digital converter 14 as follows:

$$M \cdot R = ({}^{KE}RX^2\ )/({}^{E}R^z 2^x) \cdot (R/2^{y-x}) \leqslant 2^z,$$

because analog to digital converter 14 saturates at $2^z$.
because analog to digital converter 14 saturates at $2^z$.

The resulting product signal ($M \cdot R \leqslant 2^z$) provided by multiplier 18 is applied to summing means 20 and summed thereby with error signal $E_e$ from analog to digital converter 14. Signal M·R equals the number if counts converter 14 would produce of the resolution of converter 8 is $2^x \cdot 2^{y-x} = 2y$ counts. Signal M·R will equal a maximum of $2^z$ counts if:

$$(KE_{RZ})/(E_{RZ}) = 2x,$$

and R is at its maximum of $2^{y-x}$ counts. The summation signal from summing means 20 is applied to integrator 22 to update the integrator and to close the feedback loop as described with reference to FIG. 2. The signal provided by summing means 20, which is actually an error signal corresponding to the final difference between the signals from sensor 2 and digital to analog converter 8, has the capability of reaching zero counts under any condition of voltage error between the output of sensor 2 and the output of digital to analog converter 8.

In view of the above it will now be understood that the aforenoted objects of the invention have been achieved. Higher feedback resolution is obtained without additional hardware. Digital feedback resolution of $2^{x+z}$ can be obtained through the use of an analog to digital converter with a resolution of $\pm 2^z$ and a digital to analog converter with a resolution of $2^x$. In this connection it is noted that in the illustrative description the resolution of converter 8 is positive only since the converter is controlled by integrator 22 which has a positive resolution. The configuration illustrated eliminates hunting in the feedback system without sacrificing gain or introducing dead band and minimizes the loss of information due to lack of resolution.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. In an analog to digital conversion system of the type including means for summing an analog input signal with a feedback signal from a digital to analog converter to provide an error signal, means for adjusting the gain of the error signal, an analog to digital converter for converting the analog signal to a digital signal, computer means including an integrator for integrating the digital signal and for providing a digital output corresponding to the analog input signal and divider means for dividing the integrated digital signal by a predetermined scale factor signal, the digital to analog converter connected to the divider means for converting the signal therefrom to an analog signal which scales the integrator to said converter, the improvement comprising:

- the signal from the divider means including a quotient signal and a remainder signal;
- the digital to analog converter converting the quotient signal to an analog signal which scales the integrator to said converter;
- the computer means including means for combining the remainder signal with a signal which is a function of the gain adjustment of the error signal and the least significant bit in the converters to provide a first combined signal, means for combining the first combined signal with the digital signal from the analog to digital converter to provide a second combined signal, and the integrator integrating the second combined signal.

2. An analog to digital conversion system as described by claim 1, wherein:

the means for combining the remainder signal with a signal which is a function of the gain adjustment of the error signal and the least significant bit in the converters to provide a first combined signal includes means for multiplying said signals to provide the first combined signal.

3. An analog to digital conversion system as described by claim 1, wherein:

the means for combining the first combined signal with the digital signal from the analog to digital converter includes means for summing said signals to provide the second combined signal.

4. An analog to digital conversion system as described by claim 1, wherein:

the analog to digital converter has a first resolution;

the digital to analog converter has a second resolution; and the system has a resolution which is the product of the first and second resolutions.

5. An analog to digital conversion system as described by claim 4, wherein:

the integrator has a third resolution;

the quotient signal corresponds to a resolution equal to or less than the second resolution; and the remainder signal corresponds to a resolution equal to or less than the third resolution divided by the second resolution.

6. An analog to digital conversion system as described by claim 1, wherein:

the first combined signal corresponds to a resolution equal to or less than the first resolution.

* * * * *